(12) United States Patent
Yang et al.

(10) Patent No.: US 9,819,226 B2
(45) Date of Patent: Nov. 14, 2017

(54) LOAD POWER DEVICE AND SYSTEM FOR REAL-TIME EXECUTION OF HIERARCHICAL LOAD IDENTIFICATION ALGORITHMS

(71) Applicant: EATON CORPORATION, Cleveland, OH (US)

(72) Inventors: Yi Yang, Milwaukee, WI (US); Mayura Arun Madane, Maharashtra (IN); Prachi Suresh Zambare, Maharashtra (IN)

(73) Assignee: EATON CORPORATION, Cleveland, OH (US)

( * ) Notice: Subject to any disclaimer, the term of this patent is extended or adjusted under 35 U.S.C. 154(b) by 409 days.

(21) Appl. No.: 14/556,515

(22) Filed: Dec. 1, 2014

(65) Prior Publication Data

US 2016/0156225 A1 Jun. 2, 2016

(51) Int. Cl.
| | | |
|---|---|---|
| *H02J 13/00* | (2006.01) | |
| *G01R 19/25* | (2006.01) | |
| *H02J 3/00* | (2006.01) | |
| *G01R 21/06* | (2006.01) | |

(52) U.S. Cl.
CPC ...... *H02J 13/0006* (2013.01); *G01R 19/2513* (2013.01); *H02J 3/00* (2013.01); *G01R 21/06* (2013.01); *Y02B 70/3216* (2013.01); *Y02B 70/3241* (2013.01); *Y02B 90/226* (2013.01)

(58) Field of Classification Search
CPC . G01R 19/2513; G01R 21/06; H02J 13/0006; Y02B 70/3216; Y02B 70/3241; Y02B 90/226; Y02B 90/244
See application file for complete search history.

(56) References Cited

U.S. PATENT DOCUMENTS

| | | | |
|---|---|---|---|
| 4,858,141 A | 8/1989 | Hart et al. | |
| 5,483,153 A | 1/1996 | Leeb et al. | |
| 5,717,325 A | 2/1998 | Leeb et al. | |
| 5,835,901 A | 11/1998 | Duvoisin, III et al. | |
| 5,910,875 A | 6/1999 | Tian et al. | |
| 6,081,123 A | 6/2000 | Kasbarian et al. | |
| 7,268,989 B2 | 9/2007 | Parker et al. | |
| 7,362,552 B2 | 4/2008 | Elms et al. | |
| 8,437,882 B2 * | 5/2013 | Craig | G06Q 10/00 700/22 |

(Continued)

FOREIGN PATENT DOCUMENTS

| | | |
|---|---|---|
| AU | 2012311097 A1 | 5/2013 |
| EP | 2026299 A1 | 2/2009 |

(Continued)

OTHER PUBLICATIONS

GE, "Wireless Lighting Control: Duplex Receptacle", Model 45605, May 15, 2009.*

*Primary Examiner* — Ryan Johnson
(74) *Attorney, Agent, or Firm* — Eckert Seamans; John Powers; Grant Coffield

(57) ABSTRACT

A load power device includes a power input; at least one power output for at least one load; and a plurality of sensors structured to sense voltage and current at the at least one power output. A processor is structured to provide real-time execution of: (a) a plurality of load identification algorithms, and (b) event detection and operating mode detection for the at least one load.

19 Claims, 7 Drawing Sheets

(56) References Cited

U.S. PATENT DOCUMENTS

| | | |
|---|---|---|
| 8,756,181 B2 | 6/2014 | Lu et al. |
| 2007/0086124 A1 | 4/2007 | Elms et al. |
| 2009/0072985 A1 | 3/2009 | Patel et al. |
| 2010/0187914 A1 | 7/2010 | Rada et al. |
| 2013/0066479 A1 | 3/2013 | Shetty et al. |
| 2013/0138669 A1 | 5/2013 | Lu et al. |

FOREIGN PATENT DOCUMENTS

| | | |
|---|---|---|
| EP | 2051379 B1 | 1/2011 |
| EP | 2389617 A1 | 11/2011 |
| EP | 2529190 A1 | 12/2012 |
| GB | 2465367 A | 5/2010 |
| WO | 2008142173 A1 | 11/2008 |
| WO | 2010005985 A1 | 1/2010 |
| WO | 2011002735 A1 | 1/2011 |
| WO | 2011091441 A1 | 7/2011 |
| WO | 2011091444 A1 | 7/2011 |
| WO | 2013063786 A1 | 5/2013 |

\* cited by examiner

LOAD POWER DEVICE AND SYSTEM FOR REAL-TIME EXECUTION OF HIERARCHICAL LOAD IDENTIFICATION ALGORITHMS

This invention was made with Government support under DE-EE0003911 awarded by the Department of Energy National Energy Technology Laboratory. The Government has certain rights in this invention.

BACKGROUND

Field

The disclosed concept pertains generally to electric loads and, more particularly, to load power devices that power such loads. The disclosed concept also pertains to energy systems including load power devices that power electric loads.

Background Information

Power consumption monitoring and energy management of plug-in electric loads (PELs) inside buildings are often overlooked. By knowing the operating mode (e.g., operating status) of an electric load, energy savings can be achieved with effective management and control thereof. Also, operating mode and energy consumption of electric loads need to be communicated to building management systems in an automatic, low cost and non-intrusive manner.

Electric loads often present unique characteristics in outlet electric signals (i.e., voltage; current; power). Such load characteristics provide a viable mechanism to identify operating status (e.g., without limitation, active; standby) by analyzing the outlet electric signals.

Prior proposals include usage of wavelet coefficients obtained from wavelet transforms and event detection to detect switching of the load. Also, basic power quality related signatures (e.g., one or more of apparent power, cos (phi), active energy, reactive energy, frequency, period, RMS current, instantaneous current, RMS voltage, instantaneous voltage, current harmonic THD (total harmonic distortion) percentage, voltage harmonic THD percentage, spectral content of the current waveform, spectral content of the voltage waveform, spectral content of the active power waveform, spectral content of the reactive power waveform, quality of the network percentage, time, date, temperature, and humidity) are used as a signature to identify a load and its operating status.

For example, a load is in a standby mode when the current value obtained for each load current is less than a percentage of the maximum for each load current in the normal operating state. When an electric appliance plugged into a master socket consumes power less than a suitable threshold (e.g., that of standby power), then those peripheral sockets might be switched off automatically to cut further power consumption. While this may be true for some electric devices, other electric loads (e.g., without limitation, microwaves; refrigerators) have ON-OFF behavior which is a unique internal behavior of the electric load itself (e.g., a desktop computer low power mode). It is not user friendly if the "OFF" cycle of such a device is improperly considered to be a "standby" mode and such load is then turned OFF.

There are known challenges and constraints to make load identification algorithms execute in real-time. Implementation of load identification algorithms in real-time relies on the actual use status of loads and user-behavior. Not all of the information from every moment is useful for meaningful load identification. Hence, ensuring that different levels of load identification algorithms are enabled at the right moments is essential to obtaining accurate, reliable, and trustful performance.

As a challenging real-time system, reliable event detection and operating mode detection is key to ensuring that important power cycles are not missed during processing. It is believed that pre-acquiring and processing data would give false results. Since a complete load identification system has various levels of algorithms which need to be processed in real-time to generate desired results, the proper scheduling of corresponding tasks is also critical.

There is room for improvement in load power devices.

There is further room for improvement in energy systems including load power devices.

SUMMARY

These needs and others are met by embodiments of the disclosed concept, which provides a load power device with real-time execution of: (a) a plurality of load identification algorithms, and (b) event detection and operating mode detection for a number of loads.

In accordance with one aspect of the disclosed concept, a load power device comprises: a power input; at least one power output for at least one load; a plurality of sensors structured to sense voltage and current at the at least one power output; and a processor structured to provide real-time execution of: (a) a plurality of load identification algorithms, and (b) event detection and operating mode detection for the at least one load.

As another aspect of the disclosed concept, an energy system comprises: a plurality of load power devices, each of the load power devices comprising: a power input, at least one power output for at least one load, a plurality of sensors structured to sense voltage and current at the at least one power output, and a processor structured to provide real-time execution of: (a) a plurality of load identification algorithms, and (b) event detection and operating mode detection for the at least one load; and an energy management system remote from and in communication with the load power devices.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" shall mean a programmable analog and/or digital device that can store, retrieve, and process data; a computer; a workstation; a personal computer; a controller; a microprocessor; a microcontroller; a microcomputer; a digital signal processor (DSP); a central processing unit; a mainframe computer; a mini-computer; a server; a networked processor; or any suitable processing device or apparatus.

The disclosed concept is described in association with example load power devices, loads and example load features, although the disclosed concept is applicable to a wide range of load power devices, loads and a wide range of load features.

The disclosed concept can be employed by, for example and without limitation, power strips, smart power strips, receptacles, smart receptacles, outlets, plugs, power/energy meters, power/energy monitoring at a circuit branch level for building energy management, single phase UPSs, building energy management systems, and building level load control for load shedding and demand response.

As employed herein, the term "load power device" shall mean a power strip, a smart power strip, a receptacle, a smart receptacle, an outlet, a plug, and a single phase UPS.

The disclosed concept embeds a complete set of hierarchical load identification (ID) algorithms in one system. The algorithms include: Mode ID, Level1 ID, Level2 ID and Level3 ID. Non-limiting examples of these three levels and various operating modes are disclosed by U.S. Pat. Appl. Pub. No. 2013/0138669, entitled System and Method Employing a Hierarchical Load Feature Database to Identify Electric Load Types of Different Electric Loads, which is incorporated by reference herein. A state machine engine is supported by event detection and operating mode detection sub-systems to continuously define the corresponding states of the system in real-time. The system functions to meet time constraints and provide real-time performance.

Figure 1:
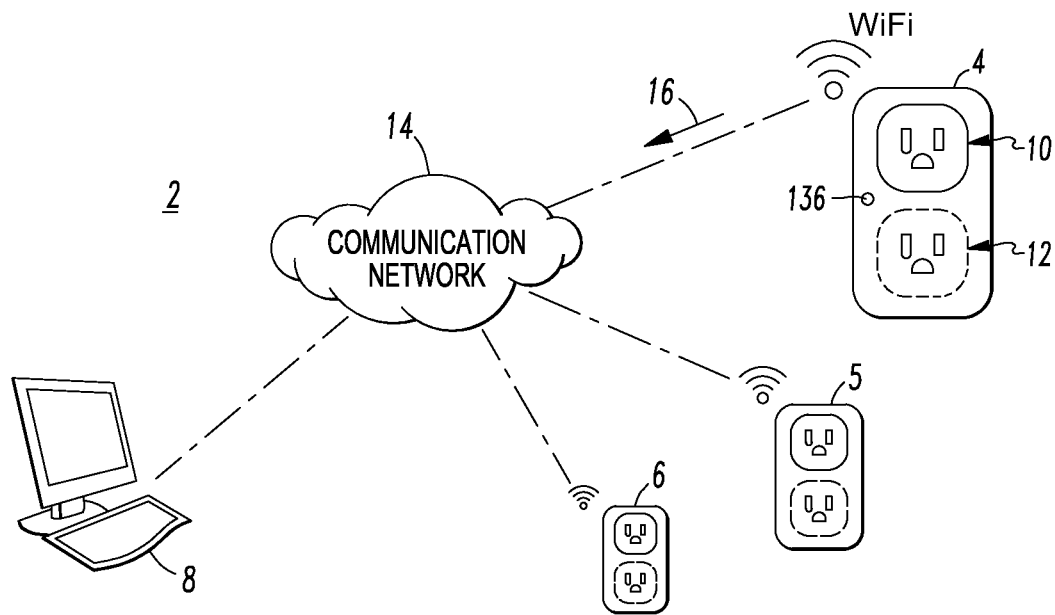
FIG. 1 is block diagram of an energy system including a number of smart receptacles (SRs) and a remote energy management system (REMS) in accordance with embodiments of the disclosed concept.

Referring to FIG. 1, an energy system 2 includes a number of smart receptacles (SRs) 4,5,6 and a remote energy management system (REMS) 8. The REMS 8 provides users with fine granular visibility of plug-in load (not shown) usage, and ensures flexible and effective management of plug-in loads in residential and commercial building environments in the SR+REMS energy system 2. The SRs 4,5,6 distribute power to downstream plugged-in devices (not shown) similar to conventional power strips and receptacles, but with a pre-designated ALWAYS-ON-Load-Outlet (ALO) 10 and a Controllable-Load-Outlet (CLO) 12. Uncontrolled devices (not shown) are plugged into the ALO 10, and controlled devices (not shown) are plugged into the CLO 12, as shown with the example SR 4. The SR 4 reports an energy or power consumption profile 16 for each outlet 10,12 in real-time, and identifies device types including banned load devices.

As will be discussed, the SR 4 measures electrical signals at the load outlet level, has embedded load identification algorithms to support continuous monitoring of plugged-in devices (including, for example, power consumption, device type, and operating status), and conveys the relevant information to the REMS 8.

The SR 4 is preferably Wi-Fi compliant with a Wi-Fi Protected Setup (WPS) association, and supports HTTP/FTP protocols. Any suitable Wi-Fi device that supports web-browsing (e.g., without limitation, iPhone; smart phone; PC) can serve as the REMS 8, and create a local or remote communication network 14 to manage the multiple SRs 4,5,6.

The REMS 8 displays the status of all plugged-in devices (not shown) in the communication network 14 and aggregates information by device classes and/or load operating modes. The REMS 8 allows users to personalize control strategies when managing corresponding devices.

Figure 2A:
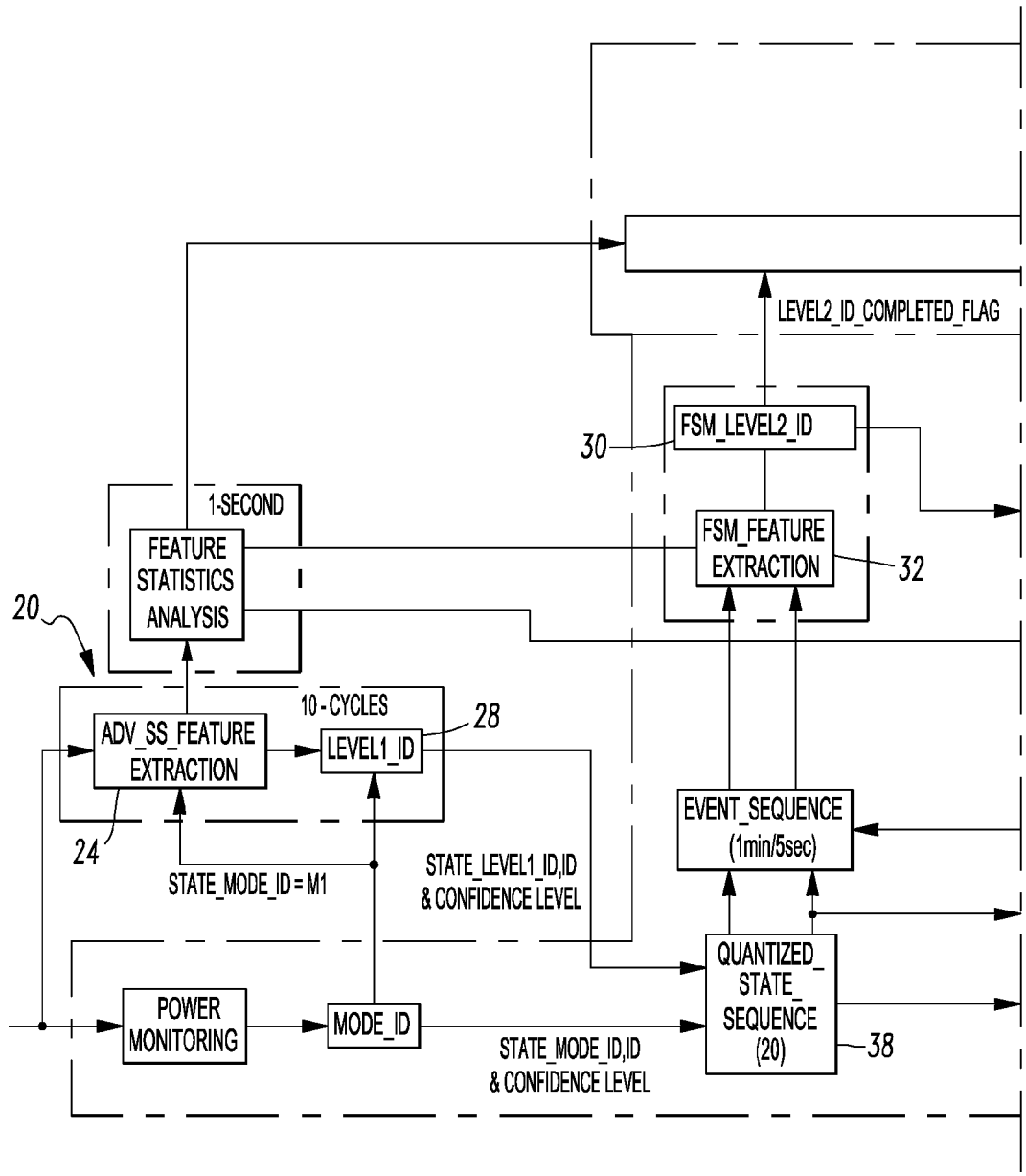
FIGS. 2A and 2B are two portions of a single block diagram of a hierarchical load identification system architecture for embedded implementation in the SR of FIG. 1.
Figure 2B:
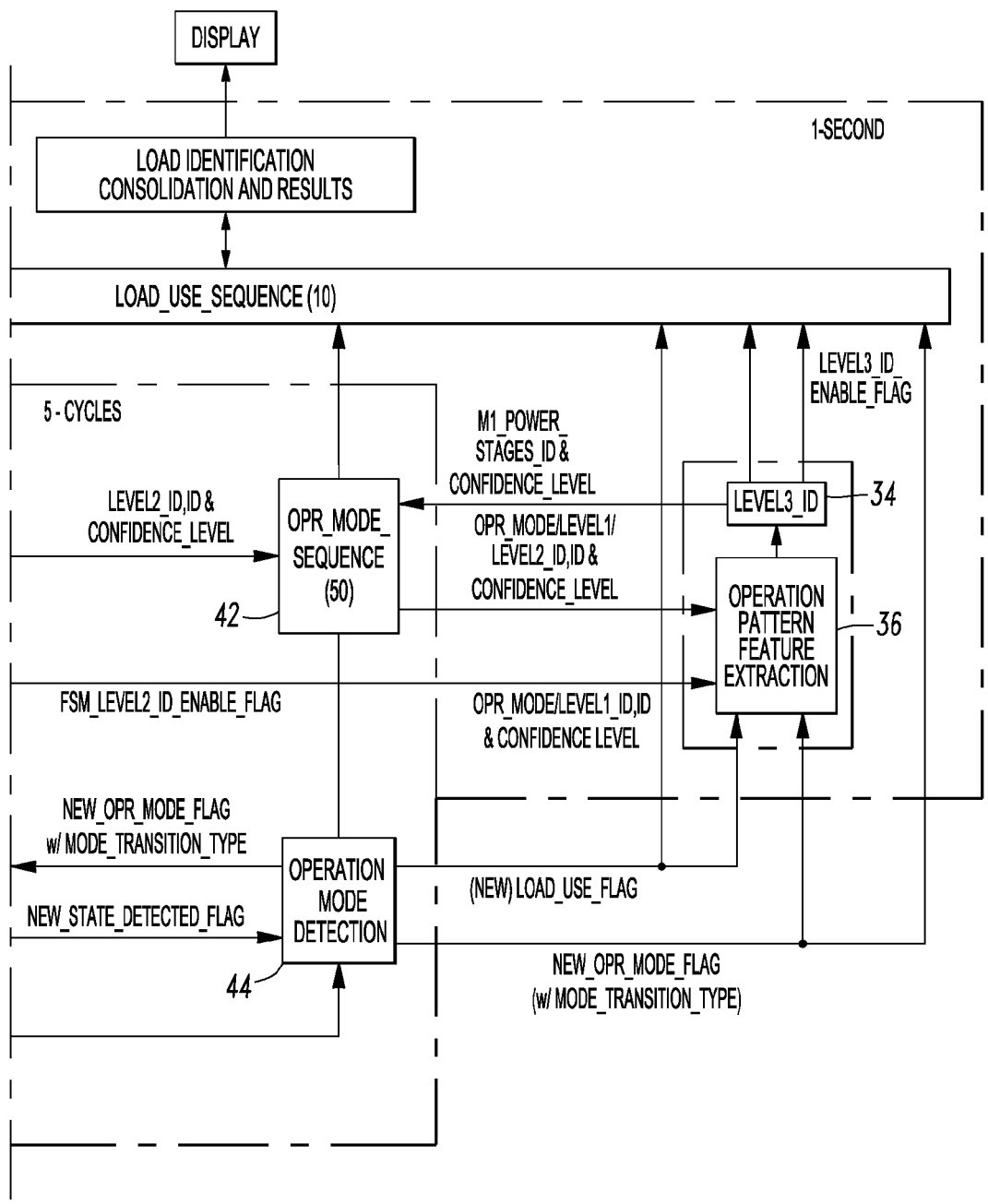
Figure 3:
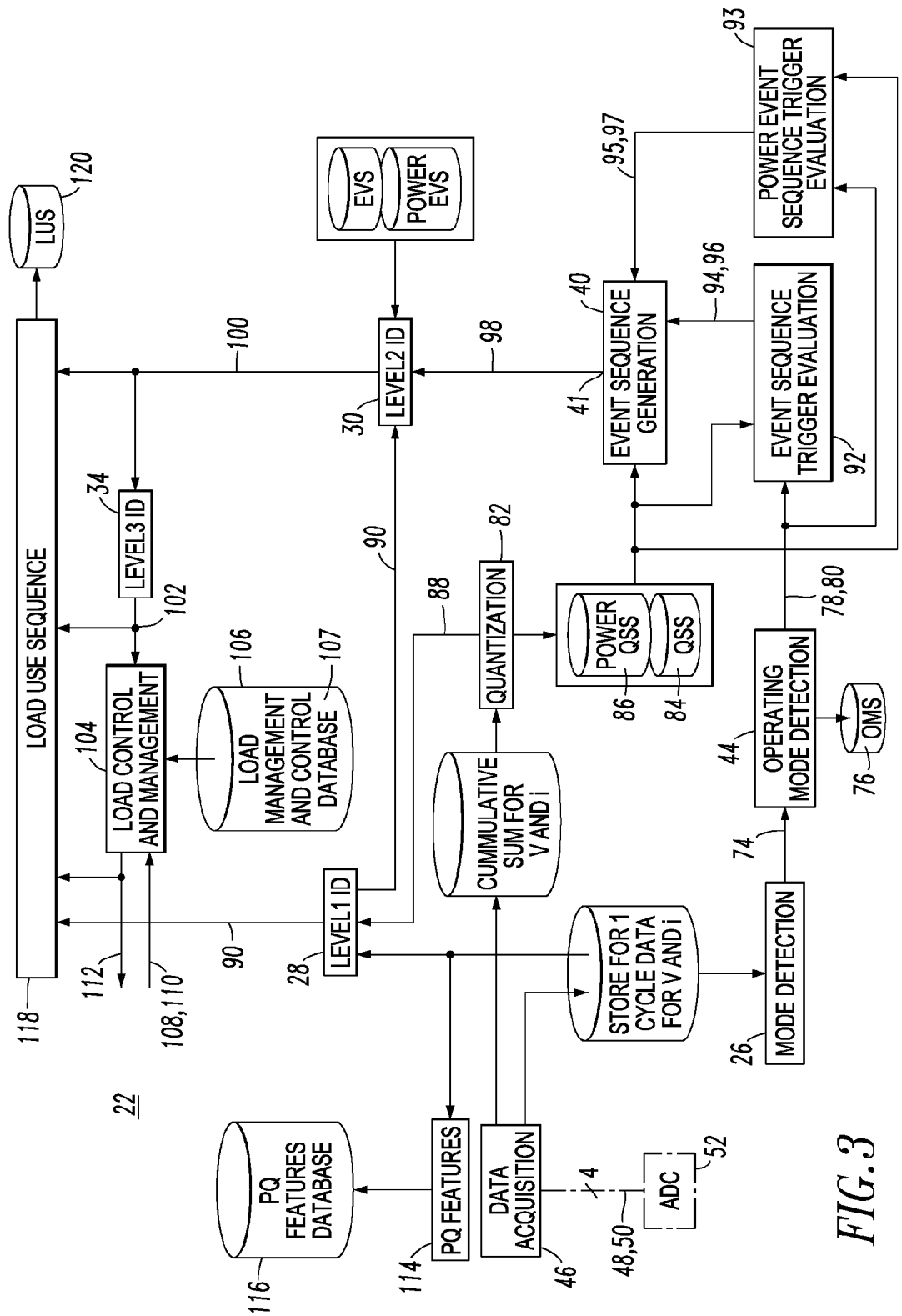
FIG. 3 is a block diagram of a hierarchical load identification system architecture for embedded implementation in the SR of FIG. 1.

FIGS. 2A and 2B show a hierarchical load identification system architecture for embedded implementation in the SR 4 of FIG. 1. The SR system includes two major groups of functions: (1) core functions 20 for load identification and classification; and (2) a state machine engine 22 (FIG. 3). For load identification and classification, the basic core functions 20 include: (1) steady state features extraction 24; (2) operating mode detection 44; (3) level 1 identification 28; (4) level 2 identification 30; (5) level 2 finite state machine (FSM) (a state based algorithm) feature extraction 32; (6) level 3 identification 34; and (7) operating pattern feature extraction 36.

In real-time implementation, the operation of these seven functions is controlled by the state machine engine 22 (FIG. 3). Each of these seven functions may be enabled or disabled when the SR system is in a different state. The following four functions: (1) quantized state sequence generation 38; (2) event sequence generation 40; (3) operating mode sequence generation 42; and (4) operating mode detection 44, are used by the state machine engine 22, which establishes the states of the SR system based on the actual load status. FIGS. 2A and 2B show software functional blocks, which provide activities/tasks performed therein, functions that run at an example rate of 1920 Hz/1600 Hz, functions that run at an example period of 5 cycles (80 ms/100 ms), functions that run at the example period of 5 cycles (80 ms/100 ms) provided trigger conditions are true, and functions that run at the example period of 5 cycles (80 ms/100 ms) if input results are available.

Most electric loads show a unique mode transition behavior. The mode transition state is dependent on the type of event. Consider, for example, three components including a power strip outlet relay (RL) (see, e.g., relay 13 of FIG. 6), an electric load such as a plugged load (LD) (see, e.g., loads (LDs) of FIG. 6), and a power strip (PS) (not shown, but see the example SR 4 of FIG. 1). Six operating modes include the load operating mode M1, the load low power mode M2 (e.g., without limitation, standby; hibernating; energy saving), the parasitic mode M3 (the load is locally switched off but is still electrically connected to mains power (see, e.g., mains power input 135 of FIG. 6) and is still consuming a relatively small amount of power), a mode M4 in which no load is plugged into the PS outlet, a PS outlet switched off mode M0, and a mode M00 in which the entire PS is plugged off or switched off.

Table 1 shows the modes versus the status of the components.

TABLE 1

| Mode | RL | LD | PS | Power | Remarks |
|---|---|---|---|---|---|
| M1 | ON | ON | ON | +++ | Load ID needed |
| M2 | ON | ON | ON | ++ | Always followed by M1 |
| M3 | ON | OFF | ON | + | Parasitic mode |
| M4 | ON | NULL | ON | 0 | RL = ON; power = 0; no load connected |
| M0 | OFF | X | ON | 0 | RL = OFF |
| M00 | x | X | OFF | x | |

The following discusses the state machine definition for load ID real-time implementation. The operating mode definition is shown in Table 2.

TABLE 2

| Relay State | Pwr_Mode | Mode | Description |
|---|---|---|---|
| Relay Open | No_Pwr_Mode | M0 | Relay open |
| Relay Open | No_Pwr_Mode | M4 | Load unplugged |
| Relay Close | Pwr_Mode | M1 (M1_H) | Load operating (providing service) |
| Relay Close | Pwr_Mode | M2 (M1_L) | Load low power (standby; sleeping; idle) |
| Relay Close | Pwr_Mode | M3 | Load parasitic (load turned off; extreme low power) |

Table 3 shows the operating mode transition.

TABLE 3

| Transition Index | Previous Mode | New Mode | Transition Flag |
|---|---|---|---|
| T1 | M4/M0 | M0/M4 | Remain_No_Pwr |
| T2 | M4/M0 | M1 | First_PowerON |
| T3 | M4/M0 | M2 | First_Operation |
| T4 | M4/M0 | M3 | Pwr_WO_Operation |
| T5 | M1 | M4/M0 | Deprive_Pwr |
| T6 | M1 | M2 | Downto_Low_Pwr |
| T7 | M1 | M3 | Downto_Parasitic |
| T8 | M2 | M4/M0 | Deprive_Pwr |
| T9 | M2 | M1 | Ongoing_Operation |
| T10 | M2 | M3 | Downto_Parasitic |
| T11 | M3 | M4/M0 | Deprive_Pwr |
| T12 | M3 | M1 | Back_to_Operation |
| T13 | M3 | M2 | Back_to_Operation |

Table 4 shows additional steps to designate the transition of "Back_to_Operation".

TABLE 4

| Previous Transition | Previous Mode | New Mode | Transition Flag |
|---|---|---|---|
| Parasitic (M1/M2 > M3) | M3 | M1 | Ongoing_Operation |
| Operation (M4/M0 > M3) | M3 | M1 | First_PowerON |

Table 5 shows meaningful transitions that affect the status of the SR system and define various scenarios for the load identification system.

TABLE 5

| Power Change | Meaningful Transition | Comments |
|---|---|---|
| Not applicable | | Transition does not occur |
| | Remain_No_Pwr | Transition between two No_Pwr_Modes; no plugged load; open relay |
| Increase | First_PowerON | The load operates for the first time since the power is given |
| Increase | Ongoing_Operation | Sequential operation of the load after the first transition (may not be applicable to some loads) |
| Increase | Pwr_WO_Operation | The load is given power but is locally turned OFF (without operation) |
| Reduce | Downto_Low_Pwr | The load cycles to a low power mode; the load is still locally ON |
| Reduce | Downto_Parasitic | The load cycles to an extremely low power mode or is locally turned OFF |
| Reduce | Deprive_Pwr | Power has been deprived from the load; the load is unplugged; the relay is open |

The various operating modes and transitions form the base for the state machine engine 22 (FIG. 3), which is used to define the corresponding states of the SR system continuously in real-time. The established state machine 22 ensures that the different levels of load identification algorithms (part of the core functions 20 of FIGS. 2A and 2B) are enabled only at the proper times. This mechanism is advantageously employed to obtain an accurate, reliable, and trustful performance of the hierarchical load identification algorithms.

Data acquisition 46 (FIG. 3) inputs two voltages 48 and two currents 50 from an analog to digital converter (ADC) 52 (shown in phantom line drawing in FIG. 3). The functions of the data acquisition 46 include block reads of all four digitally converted inputs 48,50, two for each example outlet 10,12 (FIG. 1), at the example rate of 1920/1600 Hz, and data acquisition and storage. During power on, the data acquisition 46 performs analog input offset calibration of the ADC 52.

Figure 4:
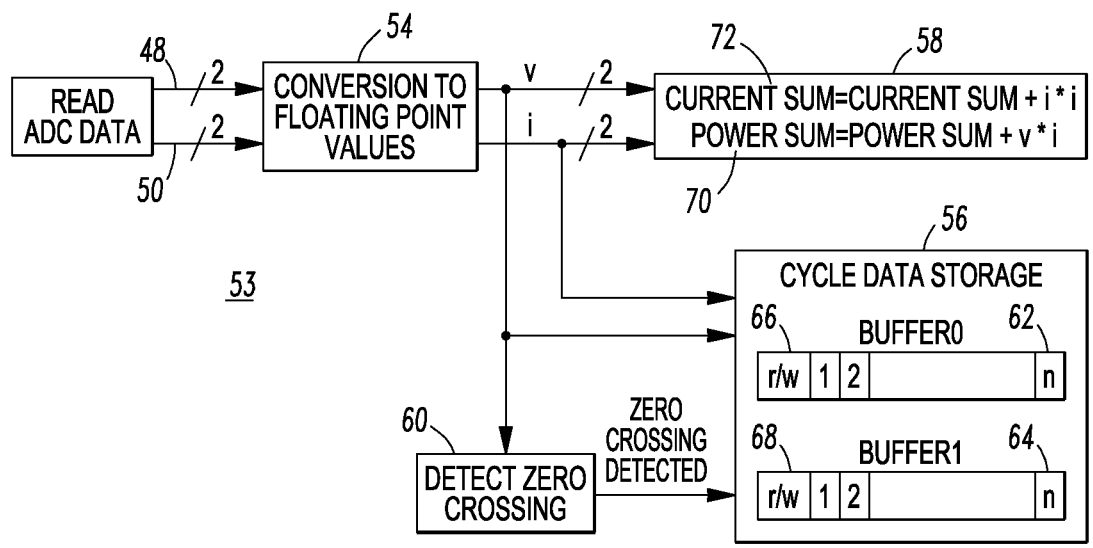
FIG. 4 is a block diagram of major data acquisition functions and their sequence for the state machine engine of the SR of FIG. 1.

FIG. 4 shows the major data acquisition functions 53 and their sequence. The inputs 48,50 are converted to floating point values at 54. The calculated floating point values (v, i) are stored in cycle data storage 56 and cumulative sums 58. The cycle data is stored for each voltage zero crossing as detected at 60. The cycle data storage 56 has a double buffer scheme. The two buffers 62,64 are switched if they are fully occupied. The buffers 62,64 have respective read/write access bits 66,68, which are used for buffer read/write access control. The cumulative sums 58 include: (1) an average power sum 70: the sum of the multiplication of the instantaneous samples of the voltage and current channels; and (2) an RMS current sum 72: the sum of the square of the instantaneous current samples. The outputs of the data acquisition functions 53 include the cycle data storage buffers 62,64 and the sums 70,72.

The mode detection function 26 (FIG. 3) inputs from the cycle data buffers 62,64 (FIG. 4) and performs these actions: (1) executes at an example period of 80 ms/100 ms (5 cycles); (2) reads a cycle of data from the cycle data buffers 62,64; and (3) provides mode feature extraction by calculating the features for mode identification including average power, THD greater than the 7th harmonic, and cycle area. The output 74 of the mode detection function 26 includes the mode ID result with confidence level for a given cycle.

The operating mode detection function 44 (FIGS. 2B and 3) inputs the cycle mode ID results from the output 74 of the mode detection function 26. This function 44 performs these actions: (1) executes operating mode detection at an example period of 80 mS/100 ms; (2) reads cycle mode ID results; (3) filters the cycle mode ID results to obtain the present operating mode; (4) based on the present operating mode, detects the mode transition type; and (5) saves data in the operating mode sequence (OMS) 76. The outputs of the function 44 include the present operating mode 78, the mode transition type 80, and the operating mode sequence 76.

The quantization function 82 (FIG. 3) inputs the cumulative sum of current and average power. The function 82 performs these actions: (1) calculates the average current and average power at the example period of 5 cycles; (2) performs quantization and generates QSS (quantized state sequence using RMS current) and power QSS (quantized state sequence using real power); and (3) calculates features (e.g., phase angle variation; average time difference) which are specific to the state level. The outputs include QSS 84 and power QSS 86.

QSS 84 (FIG. 3) is generated by discretization of the current waveform into a set of discretized RMS current values by difference >10% and time for which the state machine 22 stays in the same current value. The quantized state sequence (QSS 84) includes the following states: (1) no power state; (2) low power state; (3) inter state; (4) semi state; and (5) steady state.

Power QSS 86 (FIG. 3) is generated by discretization of the real power waveform into a set of discretized real power values by difference >10% and time for which the state machine 22 stays in the same real power value. The power quantized state sequence (power QSS 86) includes the following states: (1) no power state; (2) low power state; (3) inter state; (4) semi state; and (5) steady state.

The Level1 ID function 28 (FIG. 3) inputs the cycle data buffers 62,64 (FIG. 4) and the detection of stable state 88 from the quantization function 82. The function 28 (on detection of the stable state 88) provides these actions: (1) reads the cycle data buffers 62,64; (2) extracts binary VI features; (3) executes a Level1 ID algorithm; (4) saves Level1 ID results to OMS (operating mode sequence) 76, QSS 84 and power QSS 86; and (5) based on the cycle level1 ID results, generates final level1 ID results. The output 90 includes the level1 ID and confidence level results for cycle, and final level1 ID results.

The event sequence trigger evaluation function 92 (FIG. 3) inputs QSS 84 and the mode transition type 80. The function 92 checks for event sequence start and stop trigger conditions and performs these actions: (1) generates TempEVS (temporary event sequence using QSS) from QSS 84; (2) checks step up and step down conditions from TempEVS; and (3) sets EVS (event sequence using QSS) start or stop triggers 94,96 based on the mode transition type 80 and step up and step down ratio. The outputs of the function 92 are the EVS start/stop triggers 94,96.

The power event sequence trigger evaluation function 93 (FIG. 3) inputs Power QSS 86 and the mode transition type 80. The function 93 checks for power event sequence start and stop trigger conditions and performs these actions: (1) generates TempPowerEVS (temporary power event sequence using Power QSS) from power QSS 86; (2) checks step up and step down conditions from TempPowerEVS; and (3) sets Power EVS (event sequence using Power QSS) start or stop triggers 95,97 based on the mode transition type 80 and step up and step down ratio. The outputs of the function 93 are the Power EVS start/stop triggers 95,97.

Event sequence (EVS) includes a set of events generated from QSS 84 (quantized state sequence calculated using RMS current). Event sequence includes the following events: (1) semi stable event—a quantized level which is present for >=1 S and <5 S; (2) stable event (as output at 88)—a quantized level which is present for >=5 S; (3) inter event—a quantized level which is present for <1 S; (4) spike event—an inter event quantized level in which the ratio between the (n+1)th level and nth level is >=1.85; (5) EQUSS (equivalent steady state) event—an EQUSS event is generated using a set of inter states and which together last for >1 S; (6) standby event—a quantized level in which the load is in the M2 mode; (7) no power event—a quantized level in which the outlet relay (RL 13 of FIG. 6) is open; and (8) low power event—a quantized level in which the relay is closed but the load is in the M4 state.

Power EVS is event sequence using Power QSS 86. Event sequence includes a set of events generated from Power QSS 86 (quantized state sequence calculated using power). Power event sequence includes the following events: (1) semi stable event—a quantized level which is present for >=1 S and <5 S; (2) stable event—a quantized level which is present for >=5 S; (3) inter event—a quantized level which is present for <1 S; (4) spike event—an inter event quantized level in which the ratio between the (n+1)th level and the nth level is >=1.85; (5) EQUSS (equivalent steady state) event—an EQUSS event is generated using a set of inter states and which together last for >1 S; (6) standby event—a quantized level in which the load is in the M2 mode; (7) no power event—a quantized level in which the outlet relay (RL 13 of FIG. 6) is open; and (8) low power event—a quantized level in which the relay is closed but the load is in the M4 state.

Figure 8:
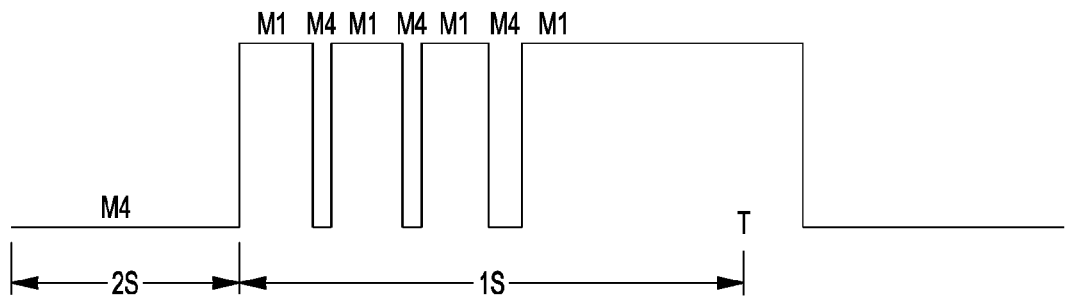
FIG. 8 is a waveform plot of an operating mode sequence which includes a set of mode transitions for a load of the SR of FIG. 1.

OMS (Operating Mode Sequence) 76 is a sequence which includes a set of mode transitions (see, e.g., FIG. 8) which are detected for greater than or equal to a one second duration. In FIG. 8, at time T, since M1 mode is present for greater than one second, the final OMS is stated as M1. Operating mode sequence (OMS 76) includes the following information: (1) mode ID—M0, M4, M3, M1, M2; (2) mode ID confidence—percentage (%) likelihood of mode identification; (3) mode duration—duration in which the load remains in the same mode; (4) mode average power—average power in one entry in the operating mode sequence; (5) mode transition type—transition type (e.g., remain no power—load is not switched ON; first operation—first time load is powered ON (M4/M1 transition); ongoing operation—ongoing operation is triggered when step up and step down conditions are satisfied; power without operation—power without operation is detected when the load goes from no power mode (M4) to parasitic mode (M3) (i.e., when M4/M3 transition is detected); down to low power—is detected when there is a transition from no power (M4) to low power (M2) transition; down to parasitic—is detected when there is a transition from operating mode (M1) to parasitic mode transition (M3); deprive power—is detected when there is an operating mode (M1)/parasitic mode (M3)/low power (M4) to no power (M4) transition (i.e., when the load is switched OFF)); (6) Level1 ID: level1 identification results in a particular mode (category type); (7) Level1 ID confidence: likelihood of level1 identification result; (8) Level2 ID: level2 identification result in particular mode (load type); and (9) Level2 ID confidence: likelihood of level2 identification result quantized level in which the relay (RL 13 of FIG. 6) is closed but the load is in the M4 state.

The event sequence generation function 40 (FIG. 3) inputs QSS 84 and power QSS 86, the EVS start/stop triggers 94,96 and the power EVS start/stop triggers 95,97. The function 40 performs these actions: (1) if the EVS start trigger 94 is detected, then for every 5 example cycles, generates EVS from QSS 84 until the EVS stop trigger 96 is detected; (2) generates power EVS from power QSS 86 until the power EVS stop trigger 97 is detected; (3) calculates 'Event' specific features (e.g., number of spikes); and (4) generates an EVS complete status trigger 98. The outputs 41 of the function 40 include EVS, power EVS and the EVS complete status trigger 98.

The event sequence start trigger 94 (FIG. 3) is in response to start conditions for event sequence generation. Event sequence is derived from quantized state sequences (QSS 84 and power QSS 86). Depending on the load usage, i.e., first time or ongoing operation, the start and stop triggers 94,96 vary, as the load startup behavior is different under these two conditions. For the first operation, there are two possibilities: (1) upon the detection of M1 mode (with a padding of 2 example seconds of cycles in the previous mode), M4/M0→M1: upon the detection of a mode change and M3→M1: upon the detection of a mode change; and (2) upon the detection of a step-up transition with the step-up ratio >1.7, if it happens 50 S after startup. For an ongoing operation, the event sequence start trigger 94 is upon the detection of M1 (with a padding of 10 example cycles of states in the previous mode): M2→M1: upon the detection of a power step-up >2, or M1/M2→M3→M1: upon the detection of a mode change (mode detection function 26).

The event sequence stop trigger 96 (FIG. 3) is in response to stop conditions for event sequence generation. If any of these conditions become true then event sequence generation is stopped. For the first operation: (1) one minute expires (immediately); and (2) step-down transition with stepdown ratio <0.4 (with a padding of 2 example seconds of states in M1_L).

The corresponding actions include: (1) the M2 mode is assigned to this M1_L (operating mode with low power); (2) mode transition (with a padding of 2 example seconds of states in the new mode); (3) M1→M3: upon the detection of a mode change (mode detection function 26); (4) M1→M4/M0: upon the detection of a mode change (mode detection function 26); (5) step-up transition with step-up ratio >1.7, if it happens 50 S after startup (immediately); (6) set an Ongoing_Operating mode transition, and the previously collected data is discarded, similar to the situation where the length of the data is not long enough—no further FSM and Level2_ID is needed since the information after this Ongoing_Operation is believed to be more valuable and another round of data collection is immediately started.

For an ongoing operation: (1) one minute expires (immediately); (2) mode transition (with a padding of 2 example seconds of states in the new mode) (e.g., M1→M2: upon the detection of a mode change; M1→M3: upon the detection of a mode change (mode detection function 26); M1→M4/M0: upon the detection of a mode change (mode detection function 26); and (3) step-up transition with step-up ratio >1.7, if it happens 50 S after startup (immediately). This condition covers the potential scenario of an E-load (electronic load) also with multiple power stages during normal operation. Based on the current observation, the chance for E-loads to have multiple stable power stages is relatively very small. Corresponding actions include: (1) the previously collected data is retained, and FSM analysis and Level2_ID are executed (it is handled differently from the similar scenario after First_Time_PowerON since the information within the 50 seconds during an Ongoing_Operation is considered to be suitably rich for the following Level2_ID); and (2) the following operations in the new power stage are ignored.

The Level2 ID function 30 (FIG. 3) inputs the final Level1 ID 90, and EVS and power EVS from the output 41 of the function 40. The function 30 performs these actions: (1) reads the Level1 ID 90; (2) based on level1 ID results, uses EVS or power EVS to extract FSM features; and (3) executes Level2 ID algorithms. The output 100 of the function 30 includes Level2 ID and confidence results.

The Level3 ID function 34 (FIG. 3) inputs Level2 ID results and OMS 76. The function 34, based on Level2 ID and operating pattern feature extraction from operating pattern information, generates Level3 ID results. The output 102 of the function 34 is the device ID results.

The load control and management function 104 (FIG. 3) inputs the device ID results, a load management and control database 106, a pushbutton input 108, and remote commands 110. The function 104 performs these actions: (1) reads a management policy compliance database 107; (2) evaluates policy compliance for the identified device ID as per the database 107; (3) raises a violation if the identified device is not adhering to the management policy; (4) evaluates user occupancy based on the load management and control database 106; and (5) based on user occupancy, and the pushbutton input 108 and remote commands 110, takes automatic/manual control action to turn on/off the SR relay (RL 13 of FIG. 6). The output of the function 104 is a relay control command 112 for the SR 4.

The PQ (power quality) features function 114 (FIG. 3) inputs the cycle data, calculates PQ features from the cycle data, and outputs example PQ features, such as active and reactive power, THD, true and displacement PF, and cumulative energy to a PQ features database 116.

The load use sequence (LUS) function 118 (FIG. 3) inputs the level1 ID 90, level2 ID 100, device ID 102 and control action 112, creates or updates an entry in the LUS database 120 based on those inputs, and outputs the LUS database 120.

Figure 5:
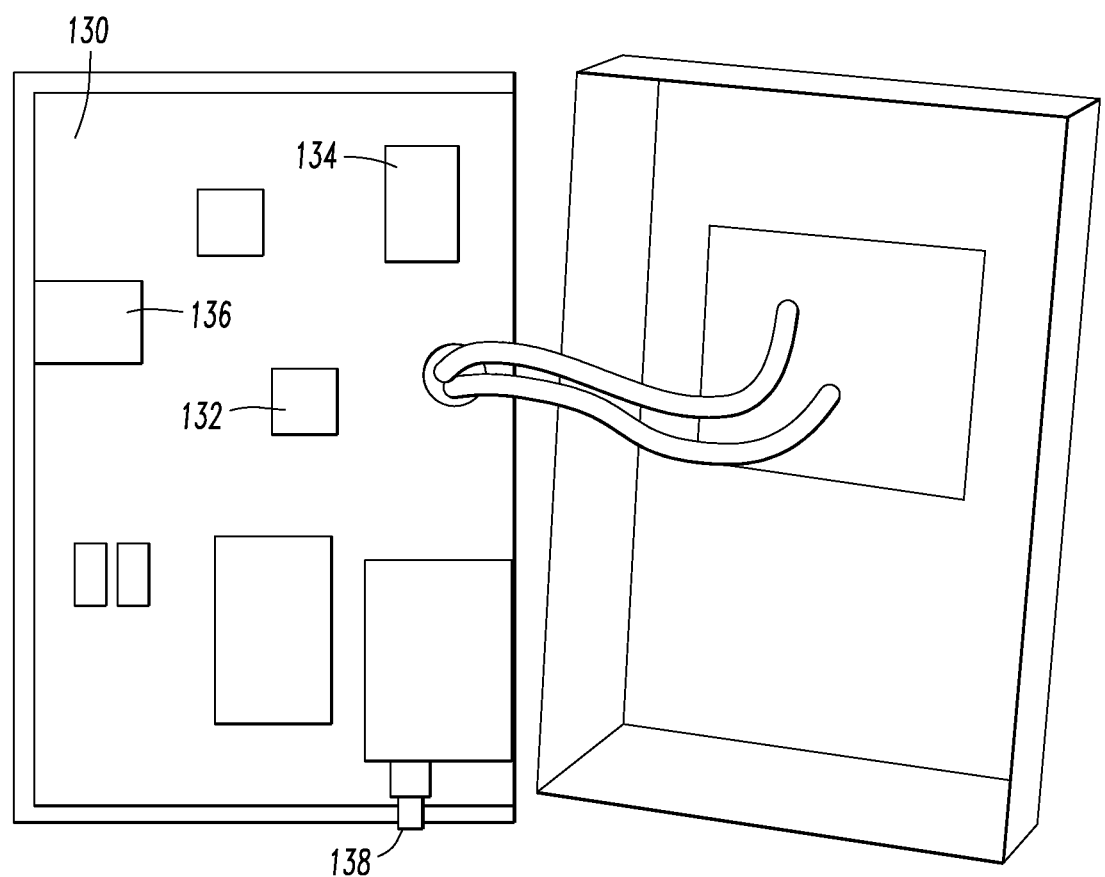
FIG. 5 is an isometric view of the SR of FIG. 1.
Figure 6:
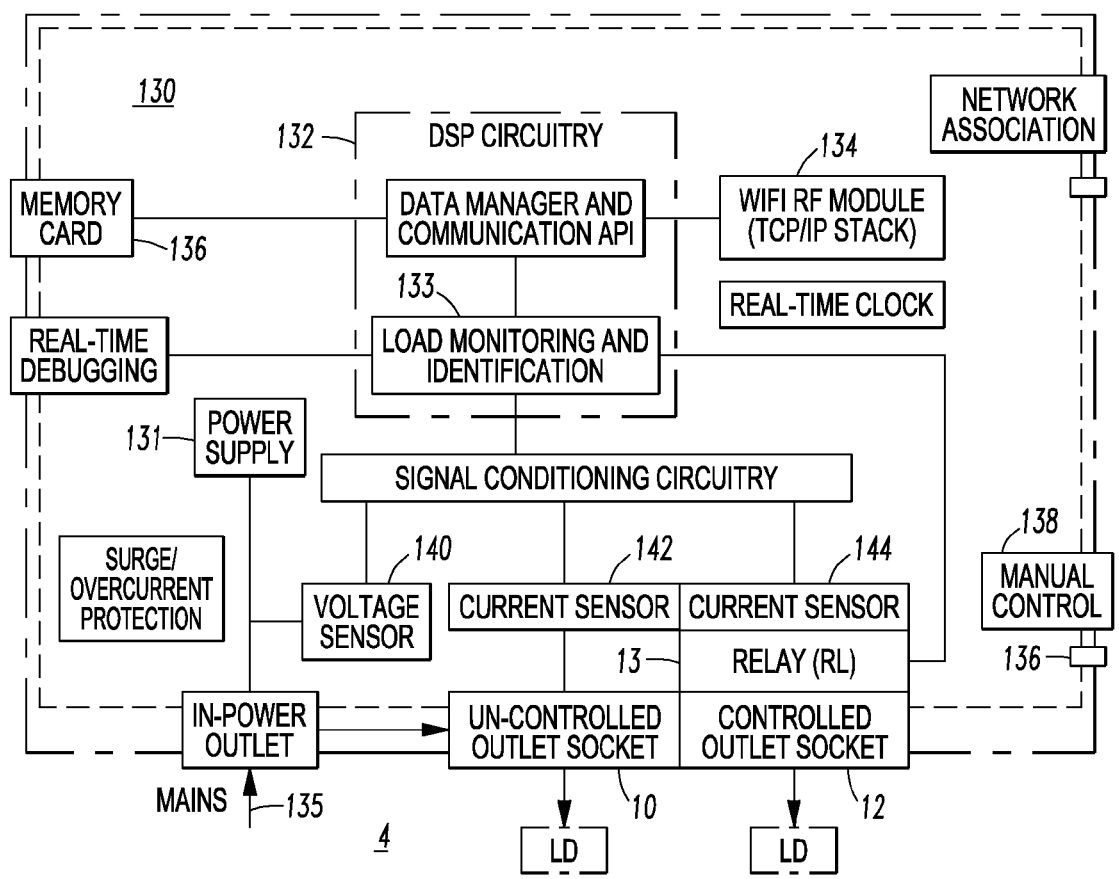
FIG. 6 is a block diagram of the SR of FIG. 1.

The load ID algorithm real-time implementation hardware platform for the SR 4 integrates the embedded load ID, plug-in loads control and management strategies, Wi-Fi communication, and a web-service-based user interface. As shown in FIG. 5, the SR 4 includes an integrated SR electronic board 130 having a self-sustained power supply 131 (FIG. 6), V/I sensing/signal sensing and conditioning at the outlet level (FIG. 4), DSP circuitry 132, and a Wi-Fi RF module 134 (e.g., IEEE 802.11.a/b/g). As shown in FIG. 6, the DSP circuitry 132 provides for embedded, nonintrusive detection of load types and operating mode identification 133. A voltage sensor 140 senses voltage at the power outlets 10,12 from the mains power input 135. Two current sensors 142,144 sense current flowing to the respective power outlets 10,12.

The distribution of power to downstream plugged-in devices is similar to conventional power strips or receptacles, but with the pre-designated ALWAYS-ON-Load-Outlet (ALO) 10 and the Controllable-Load-Outlet (CLO) 12 with relay/switch circuitry (e.g., 120 V @ 60 Hz; 230V @ 50 Hz) for the output control relay 13. A color coded light emitting diode (LED) 136 indicates CLO status and load compliance status. A mini-SD card 136 (FIG. 5) supports data logging, web page scripts, and load control/management policies. Web services support remote access of the SR 4. A pushbutton 138 provides support for CLO control manual override and OFF delay extension. The user interface of the REMS 8 (FIG. 1) includes a real-time load use status display, remote control of CLOs 12 (FIG. 1), and a PiLMC (Plug-in Loads Management and Control) configuration.

The load ID algorithm real-time implementation computation assessment for one channel is shown in Table 6. The example ADC 52 (FIG. 3) sampling rate is 1920 Hz and the fundamental line frequency is 60 Hz.

TABLE 6

|  | Timing (mS) | Execution Rate (Hz) |
|---|---|---|
| PQ steady state features extraction | 2.072 | Per 5 cycles |
| Operating mode detection algorithm | 4.86 | Per 5 cycles |
| VI steady state feature extraction | 15.32 | Per 10 cycles |
| Level1_ID - load categorization algorithm | 0.1152 | Per 10 cycles |
| Event sequence generation | 2.3 | Upon event detection |
| FSM feature extraction | 8.5 | Upon event detection |
| Level2_ID classifier (E loads startup) | 9.08 | Upon event detection |
| Level2_ID classifier (E loads long term) | 3.215 |  |
| Level2_ID classifier (X loads) | 3.85 | Upon event detection |
| Level2_ID classifier (R loads) | 2.2 |  |
| Level2_ID classifier (PAC loads) | 2.2 | Upon event detection |
| Load type ID classifier | 1 | Per second |
|  | 43.2472 |  |

In a real system, not all of the tasks shown in the above table get executed. For example, if a plugged-in load is of 'E' type, then four of the tasks (i.e., in this example, Level2_ID classifier (E loads long term), Level2_ID classifier (X loads), Level2_ID classifier (R loads) and Level2_ID classifier (PAC loads)) will not be executed. The total time of 43.2472 mS, as shown, is the worst case execution time for the worst case condition where an E load is plugged-in. The processor (e.g., DSP circuitry 132 of FIG. 6) is only one-half loaded under worst case conditions.

The disclosed concept also considers building load management policy compliance and user occupancy. Studies of building loads indicate that most plug-in loads (PELs) are present to support the process and goal-oriented activities of users, and provide strong implications of the user's occupancy. The detection of PEL event sequences can serve as a key indicator to the user's occupant activities. Based upon a suitable estimation of user's occupancy and behavioral pattern through the identification of electrical events at the outlet level caused by PELs, the estimated user's occupancy status can, consequently, be used to automatically control (turn OFF) outlets, such as CLO 12 of FIG. 1, and to reduce energy consumption while also minimizing any potential negative impact to users. At the same time, an automatic verification of building policy compliance status (e.g., without limitation, prohibited loads) can facilitate load management at the building level.

The ability to automatically identify loads promises to overcome many of the barriers to existing products, such as advanced power strips, and to drive to a more effective load control and management solution. The disclosed concept is deployed in an enhanced power outlet (e.g., without limitation, receptacle; power strip; SR 4) and a zonal network (i.e., a user workspace) and provides specific and proximate feedback at the end-user level. The monitored energy consumption is inherently and autonomously associated with the actual use of the load and the user's behavior. The contextual (i.e., personally relevant) solution enables optimized energy management by incorporating the user's behavior for a specific user scenario. It also serves as a modular, building-block for a flexible, highly-efficient building-level management system. The disclosed concept can be deployed in residential and commercial buildings, and is for both the new building and retrofitting markets.

Figure 7:
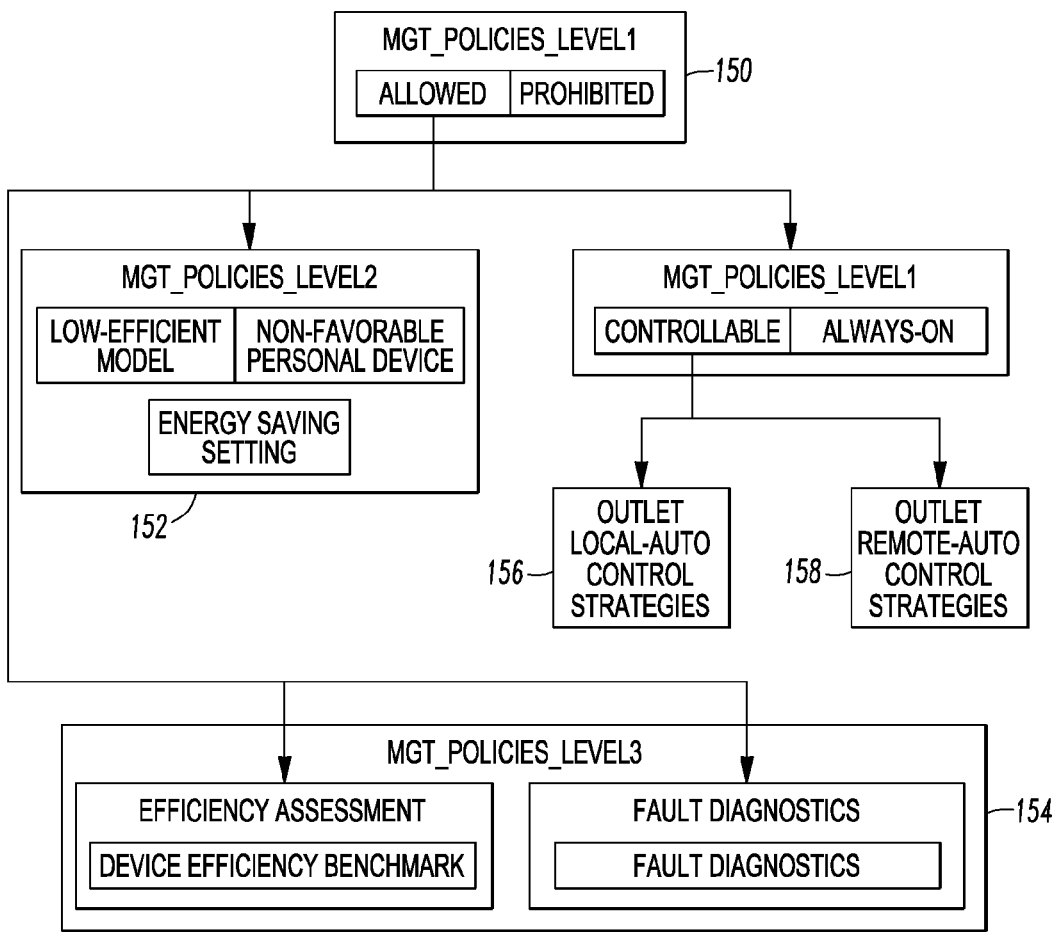
FIG. 7 is a summary diagram of building plug-in load management/control policies and strategies showing interrelations between the policies and strategies in accordance with an embodiment of the disclosed concept.

SR load control/management strategies/policies provide effective plug-in load control and management in buildings. This can be ensured by enforcing two sets of load management and control policies. First, building plug-in loads management policies refer to the policies that facility managers use to regulate the use of plug-in loads in buildings, as well as to verify how the end-users comply with the policies. The policies are grouped into three example levels as shown in FIG. 7: (1) Mgt_Policies_Level1 150; (2) Mgt_Policies_Level2 152; and (3) Mgt_Policies_Level3 154 (although, not all of these levels of management policies need to be addressed). Second, SR outlet (relay 13) control strategies refer to the conditions of when to automatically turn-ON/OFF the outlet relay (RL 13 of FIG. 6). These strategies can be based on both local and remote conditions: (1) outlet local-auto control strategies 156; and (2) outlet remote-auto control strategies 158. FIG. 7 summarizes the building plug-in load management/control policies and strategies and shows how the policies and strategies are interrelated.

The SR system maintains the load management and control database 106 including the management policy compliance database 107, where the compliance/control conditions and warning messages are provided. The users can edit the policies, for example, by adding/deleting/editing the conditions. The following are two main reasons why plug-in loads need to be managed in buildings: (1) energy saving improvement; and (2) safety.

Building plug-in load management policies are the building policies that facility managers choose to regulate the use of plug-in loads in buildings in order to address the above issues. Table 7 gives a few non-limiting examples of building-plug-in-loads management policies along with inherent violation conditions.

TABLE 7

| Level | Policy | Violation Conditions | Actionable Feedbacks | Applicable Load Examples |
|---|---|---|---|---|
| 1.1 | Keep critical loads always-ON | Critical loads are detected to plug into controllable-outlets | Flag warning-potential damage of devices; users are suggested to switch the load to uncontrollable-outlet | PCs; networking devices |

TABLE 7-continued

| Level | Policy | Violation Conditions | Actionable Feedbacks | Applicable Load Examples |
|---|---|---|---|---|
| 1.2 | Ensure all controllable loads are properly controlled | Controllable loads are detected if plugged into uncontrollable-outlets | Flag warning-devices are not properly controlled; users are suggested to change the load to a controllable outlet | User assignment |
| 1.3 | Ban usage of certain load types | The use of prohibited loads is detected | Flag alarm-users are suggested to unplug the particular plugged load; after a time-delay duration, the power is deprived from the particular load (only applies to the controllable outlet) | User assignment |
| 2.1 | Reduce usage from low-efficiency loads | The use of a low-efficient load model is detected | Flag warning-users are suggested to replace the device with a high-efficient load model | Incandescent loads; CRT |
| 2.2 | Reduce some types of personal load usage | Non-suggested personal device usage is detected | Flag warning-users are suggested not to use personal loads, but to use shared devices in a public area | User assignment |
| 2.3 | Ensure loads go to energy saving mode | The plugged loads are detected if they never go to the low power mode | Flag warning-users are suggested to set up an energy saving mode for the particular device | Same as the critical |

The enforcement of compliance of these policies is always challenging to plug-in appliances, since these appliances are normally distributed throughout a relatively large area. Auto-verification and feedback of compliance status can be centralized to facility managers and helps to simplify the process. In order to verify whether the use of a plug-in load complies with building policies, the association between the loads (or load-types) and the policies is established. Each load, by either generic load types or customized load groups, is assigned/associated with one or more management policies.

The disclosed concept considers outlet automatic control via load ID-based user occupancy status estimation. One of the building plug-in loads management policies is to ensure that all of the controllable loads can be properly turned-ON/OFF based on the need for load use, with minimum negative impact, and at the same time with maximized savings. The control, i.e., turning-ON/OFF, of the outlet relay (RL 13 of FIG. 6) is basically determined by the following: (1) the user's own wish (e.g., manual control; local/remote); (2) automatic detection of the user's occupancy (e.g., local automatic control); and (3) higher level building decision (e.g., building load management policy related, such as disable; building load shedding/demand response related, such as remote automatic control).

In accordance with the disclosed concept, a Local_Occupancy_Estimation function estimates the occupancy status of the user based on the information available to the SR 4 (with or without an external occupancy sensor). This can also be called sensorless-occupancy-estimation. Occupancy estimation is important to address the local automatic control of CLOs, such as 12, with minimized negative impact to users.

While for clarity of disclosure reference has been made herein to the example REMS display for displaying, for example and without limitation, the status of all plugged-in devices in the communication network 14, it will be appreciated that such information may be stored, printed on hard copy, be computer modified, or be combined with other data. All such processing shall be deemed to fall within the terms "display" or "displaying" as employed herein.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A load power device comprising:
   a power input;
   at least one power output for at least one load;
   a plurality of sensors structured to sense voltage and current at said at least one power output; and
   a processor structured to provide real-time execution of: (a) a plurality of load identification algorithms, and (b) event detection and operating mode detection for the at least one load;
   wherein the load identification algorithms include a mode identification algorithm and a plurality of load classification algorithms for the at least one load,
   wherein the load classification algorithms include a first level identification function structured to read a cycle data buffer of the sensed voltage and current, extract voltage-current features, and output a first level identification and a corresponding confidence level for the at least one load,
   wherein the load classification algorithms further include a second level identification function structured to input the first level identification, an event sequence and a power event sequence, extract finite state machine features, and output a second level identification and a corresponding confidence level for the at least one load,
   wherein the load classification algorithms further include a third level identification function structured to input the second level identification and operating pattern information, and output a load device identification for the at least one load, and
   wherein said processor further includes a load use sequence function structured to input the first level identification, the second level identification, the load device identification, and a control action which controls the corresponding one of said at least one power output, and to create or update a load use database.

2. The load power device of claim 1 wherein said at least one power output for the at least one load includes a first power outlet and a second power outlet; and wherein the first power outlet is always on for an uncontrolled load device and the second power outlet is controllable by said processor for a controlled load device.

3. The load power device of claim 1 wherein said processor is further structured to provide in real-time an energy or power consumption profile for each of said at least one power output.

4. The load power device of claim 1 wherein the load identification algorithms are structured to identify a device type or a banned load device powered by one of said at least one power outlet.

5. The load power device of claim 1 wherein said processor includes a power quality features function structured to input cycle data of the sensed voltage and current, calculate voltage-current features from the cycle data, and output a number of active and reactive power, total harmonic distortion, true and displacement power factor, and cumulative energy.

6. The load power device of claim 1 wherein said processor includes a user occupancy estimation function based upon user input, and a number of automatic detection of user occupancy and a building load management policy.

7. The load power device of claim 6 wherein the user occupancy estimation function is structured to estimate user occupancy status with or without an external occupancy sensor.

8. The load power device of claim 1 wherein said processor includes a state machine engine cooperating with the mode identification algorithm and the load classification algorithms.

9. The load power device of claim 8 wherein the state machine engine is structured to control steady state features extraction from the sensed voltage and current, the operating mode detection, the load classification algorithms, second level finite state machine feature extraction, and operating pattern feature extraction.

10. The load power device of claim 8 wherein the state machine engine employs quantized state sequence generation, event sequence generation, operating mode sequence generation, and the operating mode detection to establish a plurality of states based on status of the at least one load.

11. The load power device of claim 10 wherein said processor further includes a quantization function structured to input a cumulative sum of the average power and sensed current, calculate average power and average current, perform quantization and generate a quantized state sequence using RMS current and a quantized state sequence using real power, and calculate features which are specific to a current one of the states.

12. The load power device of claim 10 wherein said processor further includes an event sequence trigger evaluation function structured to generate a temporary event sequence using the quantized state sequence using real power, check step up and step down conditions from the temporary event sequence, and determine a start trigger or a stop trigger for an event sequence using the quantized state sequence using RMS current based on mode transition type and a step up and step down ratio.

13. The load power device of claim 12 wherein said processor further includes an event sequence generation function structured to generate, if the start trigger is detected, the last said event sequence from the quantized state sequence using RMS current until the event sequence stop trigger is detected, generate a power event sequence from the quantized state sequence using real power until a power event sequence stop trigger is detected, and generate an event sequence complete trigger.

14. The load power device of claim 12 wherein the start trigger is in response to start conditions for event sequence generation and the stop trigger is in response to stop conditions for event sequence generation.

15. A load power device comprising:
a power input;
at least one power output for at least one load;
a plurality of sensors structured to sense voltage and current at said at least one power output; and
a processor structured to provide real-time execution of: (a) a plurality of load identification algorithms, and (b) event detection and operating mode detection for the at least one load;
wherein the load identification algorithms include a mode identification algorithm and a plurality of load classification algorithms for the at least one load,
wherein the load classification algorithms include a first level identification function structured to read a cycle data buffer of the sensed voltage and current, extract voltage-current features, and output a first level identification and a corresponding confidence level for the at least one load,
wherein the load classification algorithms further include a second level identification function structured to input the first level identification, an event sequence and a power event sequence, extract finite state machine features, and output a second level identification and a corresponding confidence level for the at least one load,
wherein the load classification algorithms further include a third level identification function structured to input the second level identification and operating pattern information, and output a load device identification for the at least one load, and
wherein said processor further includes a load control and management function structured to read a management policy compliance database, evaluate management policy compliance based upon the load device identification, output an alert if the load device identification violates a management policy, evaluate user occupancy based on a load control database, and, based on the user occupancy and a number of local and remote commands, control a corresponding one of said at least one power output.

16. The load power device of claim 15 wherein the management policy compliance database includes plug-in loads management policies that regulate use of plug-in loads and verify user compliance of the management policies, and outlet control strategies that define local and remote conditions of when to automatically turn on or off said at least one power output.

17. An energy system comprising:
a plurality of load power devices, each of said load power devices comprising:
a power input,
at least one power output for at least one load,
a plurality of sensors structured to sense voltage and current at said at least one power output, and
a processor structured to provide real-time execution of: (a) a plurality of load identification algorithms, and (b) event detection and operating mode detection for the at least one load; and
an energy management system remote from and in communication with said load power devices, wherein the load identification algorithms include a mode identification algorithm and a plurality of load classification algorithms for the at least one load, wherein the load classification algorithms include a first level identification function structured to read a cycle data buffer of the sensed voltage and current, extract voltage-current features, and output a first level identification and a corresponding confidence level for the at least one load, wherein the load classification algorithms further include a second level identification function structured to input the first level identification, an event sequence and a power event sequence, extract finite state machine features, and output a second level identification and a corresponding confidence level for the at least one load, wherein the load classification algorithms further include a third level identification function structured to input the second level identification and operating pattern information, and output a load device identification for the at least one load, and wherein said processor further includes a load use sequence function structured to input the first level identification, the second level identification, the load device identification, and a control action which controls the corresponding one of said at least one power output, and to create or update a load use database.

18. The energy system of claim 17 wherein said energy management system wirelessly communicates with said load power devices.

19. The energy system of claim 17 wherein said energy management system is structured to provide web-browsing, create a communication network to manage said load power devices, display status of plugged-in load devices in the communication network, and aggregate information by load device classes or load operating modes.

* * * * *